(12) United States Patent
Rius Vazquez et al.

(10) Patent No.: US 8,138,783 B2
(45) Date of Patent: Mar. 20, 2012

(54) TESTABLE INTEGRATED CIRCUIT AND IC TEST METHOD

(75) Inventors: Josep Rius Vazquez, Barcelona (ES); Luis Elvira Villagra, Eindhoven (NL); Rinze I. M. P. Meijer, Herkenbosch (NL)

(73) Assignee: NXP B.V., Eindhoven (NL)

( * ) Notice: Subject to any disclaimer, the term of this patent is extended or adjusted under 35 U.S.C. 154(b) by 505 days.

(21) Appl. No.: 12/440,448

(22) PCT Filed: Sep. 4, 2007

(86) PCT No.: PCT/IB2007/053558
§ 371 (c)(1),
(2), (4) Date: Mar. 6, 2009

(87) PCT Pub. No.: WO2008/029348
PCT Pub. Date: Mar. 13, 2008

(65) Prior Publication Data
US 2009/0315583 A1    Dec. 24, 2009

(30) Foreign Application Priority Data
Sep. 6, 2006    (EP) .................................. 06120187

(51) Int. Cl.
*G01R 31/02* (2006.01)
(52) U.S. Cl. ................................. 324/762.05
(58) Field of Classification Search .................. None
See application file for complete search history.

(56) References Cited

U.S. PATENT DOCUMENTS

| | | | |
|---|---|---|---|
| 5,428,297 A * | 6/1995 | Grace et al. | 324/750.01 |
| 6,043,672 A | 3/2000 | Sugasawara | |
| 6,476,633 B2 * | 11/2002 | Yokomizo | 324/762.02 |
| 6,628,126 B2 * | 9/2003 | Allen | 324/750.3 |
| 7,376,001 B2 * | 5/2008 | Joshi et al. | 365/154 |
| 2004/0061519 A1 | 4/2004 | Buffet et al. | |
| 2004/0085059 A1 * | 5/2004 | Smith | 324/158.1 |
| 2004/0160238 A1 | 8/2004 | Ueminami et al. | |

FOREIGN PATENT DOCUMENTS

| | | |
|---|---|---|
| EP | 0672911 A | 9/1995 |
| EP | 0840227 A | 5/1998 |
| JP | 10206499 A | 7/1998 |

OTHER PUBLICATIONS

Pinedadegyvez, J., et al; "Built-In Current Sensor for IDDQ Testing"; IEEE Journal of Solid-State Circuits; IEEE Service Center, Piscataway, NJ, US; vol. 39, No. 3; Mar. 2004; pp. 511-518; XP011108381; ISSN: 0018-9200.

* cited by examiner

*Primary Examiner* — Paresh Patel

(57) ABSTRACT

A circuit portion (100) of an IC comprises a plurality of conductive tracks (130) for coupling respective circuit portion elements (150), e.g. standard logic cells, to a power supply rail (110), with the conductive tracks (130) being coupled to the power supply rail (110) via at least one enable switch (132). The circuit portion (100) further comprising an element (160) for determining a voltage gradient over the circuit portion (100) in a test mode of the integrated circuit (600), which is conductively coupled to the conductive tracks (130). The element (160) has a first end portion (164) for coupling the element (160) to the power supply terminal and a second end portion (166) for coupling the element (160) to the output (620) in the test mode. This facilitates IDDQ testing of the circuit portion (100) by means of measuring a voltage gradient over the element (160).

13 Claims, 5 Drawing Sheets

TESTABLE INTEGRATED CIRCUIT AND IC TEST METHOD

Figure 1:
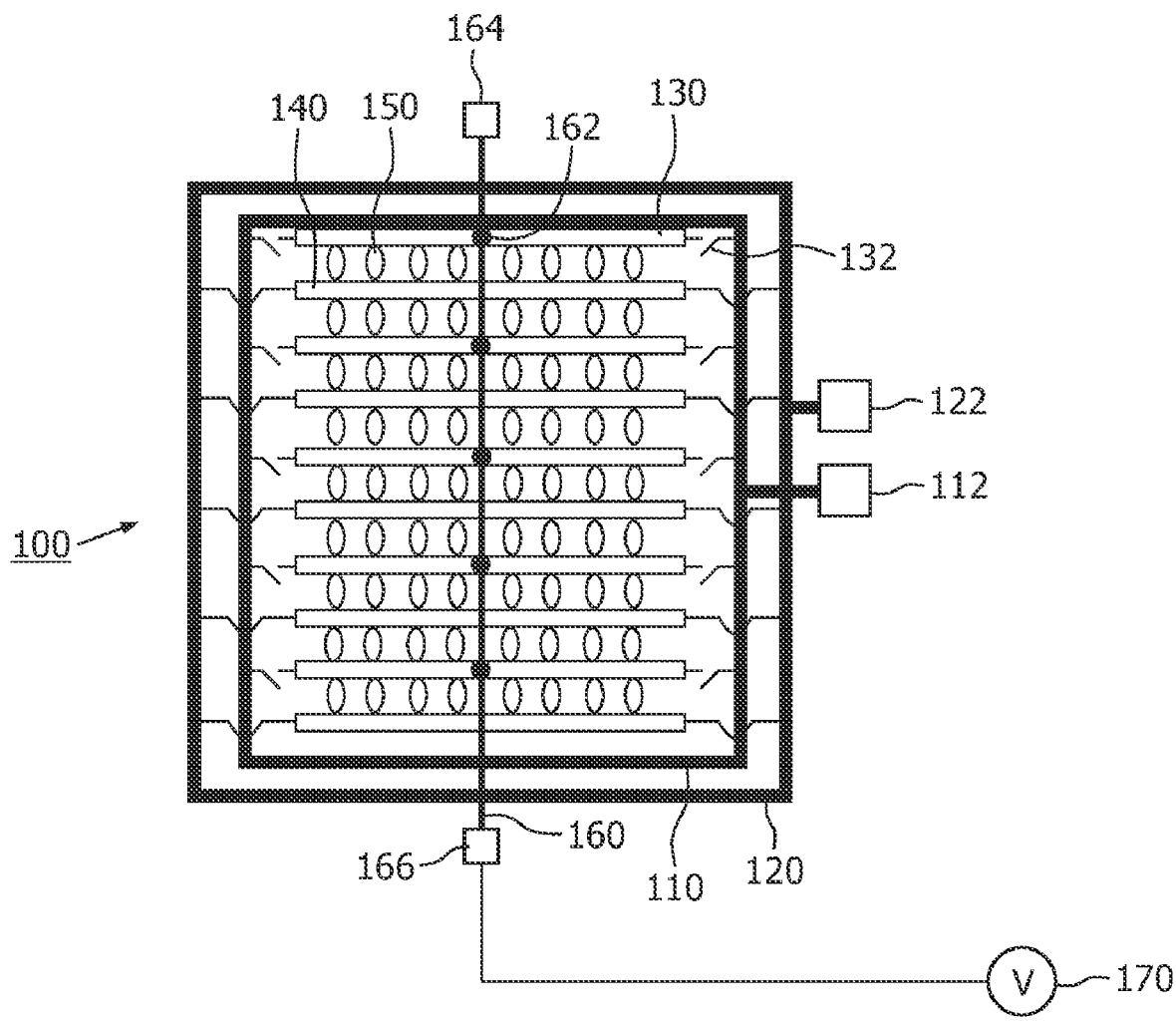

The present invention relates to an integrated circuit having a power supply terminal, an output and a circuit portion comprising a plurality of conductive tracks for coupling respective circuit portion elements to a power supply rail.

The present invention further relates to a method for testing such an integrated circuit.

In the field of integrated circuit (IC) manufacturing, testing the ICs prior to their release to customers is of importance to reduce the risk of faulty ICs being released. To this end, ICs are typically subjected to a number of different tests in order to increase the fault coverage of the test procedure. The test procedure typically comprises different types of tests, including tests that test the correct functional behaviour of the ICs, e.g. by feeding the IC with test patterns and capturing the response of the IC to those patterns.

However, such functional tests do not capture all possible IC defects. For instance, certain types of structural faults, e.g. certain types of bridges or shorts may not lead to incorrect functional behaviour, although such faults can be equally unacceptable, for instance because the IC draws an excessive amount of current from a power supply, which may be an indication of a limited lifetime expectancy of the IC or may pose overheating risks, amongst others.

A particularly useful test method to detect such structural faults is quiescent current ($I_{DDQ}$) testing. During such a test an IC is brought into a defined steady (quiescent) state, from which the current flow is measured. The amount of current flowing through the IC in this steady state is a measure of its quality, with an unusually high flow indicating the presence of structural faults. Unfortunately, with the increasing complexity of ICs, $I_{DDQ}$ testing has lost some popularity because the increase in current flow caused by a structural fault has become more difficult to detect due to the fact that the background noise in the $I_{DDQ}$ measurement resulting from 'normal' IC behaviour has increased quite dramatically.

Several solutions have been proposed to improve the resolution of IDDQ measurements. For instance, in US patent application US 2004/0061519 A1, an IC is divided in a number of sections by means of a matrix of $I_{DDQ}$ terminals on the top surface of the IC. During an $I_{DDQ}$ measurement, only the $I_{DDQ}$ terminals of selected sections are connected to the test equipment, which means that only a part of the $I_{DDQ}$ flow of the IC is measured. If the measured section contains a structural fault, this fault will be more apparent because of the reduction in background current caused by the measurement of the $I_{DDQ}$ current of only a part of the IC.

In U.S. Pat. No. 6,043,672, an IC is divided into sections, with each section being coupled to a unitary power supply via an enable transistor. To facilitate IDDQ testing at a section level, each section has its own power supply. In the $I_{DDQ}$ test mode, a section is disconnected from the unitary power supply by disabling its enable transistor and connected to its dedicated $I_{DDQ}$ power supply. The supply current drawn from the IDDQ power supply is measured to determine the $I_{DDQ}$ current for that section rather than for the whole IC. This reduces the background noise of the measurement and makes a structural error easier to detect.

Both solutions have the disadvantage that a large number of additional external terminals are required for invoking an $I_{DDQ}$ test on an IC section basis. This makes implementation of these solutions expensive, because additional external terminals such as additional pins or bond pads, significantly increase the cost of an IC.

The present invention seeks to provide an integrated circuit according to the opening paragraph for which only a few external terminals are required to perform an $I_{DDQ}$ measurement of a portion of the circuit.

The present invention further seeks to provide a method for testing such an integrated circuit.

According to a first aspect of the present invention, there is provided an integrated circuit according to the opening paragraph, the conductive tracks being coupled to the power supply rail via at least one enable switch, the circuit portion further comprising an element for determining a voltage gradient over the circuit portion in a test mode of the integrated circuit, the element being conductively coupled to the conductive tracks, the element having a first end portion for coupling the element to the power supply terminal and a second end portion for coupling the element to the output in said test mode.

The present invention utilizes the fact that nowadays many circuit portions of an IC may be disconnected from the power supply by means of one or more enable switches, for instance to bring the circuit portion in a power-down mode during which the circuit portion does not draw current from the power supply. Such circuit portions typically have a number of conductive tracks for supplying the current to the various circuit elements of the circuit portion. The coupling of an element such as a resistive wire to these conductive tracks, facilitates the connection of this element between a power supply and a voltage measuring device, which may be integrated on the IC, in a test mode of the IC. Hence, the current drawn by the circuit portion via the element in this test mode leads to a voltage gradient over the element that is proportional to said current. Consequently, an $I_{DDQ}$ value can be derived from this voltage gradient, which can be determined from the output pin to which the element is coupled.

The power supply that is connected to the element preferably is the same power supply that feeds the circuit portion because in that case no additional external power supply connections are required.

According to another aspect of the present invention, there is provided a method of testing an IC according to the first aspect of the present invention, the method comprising bringing the integrated circuit in the test mode; coupling the circuit portion to the power supply rail by switching the at least one enable switch coupled to the conductive tracks to a conductive state; bringing the circuit portion in a predefined state; isolating at least a part of the circuit portion from the power supply rail by switching the at least one enable switch to a non-conducting state; coupling the first end portion of the element to the power supply terminal; coupling the second end portion of the element to a voltage measuring device; and measuring a voltage gradient over the element.

This method facilitates a voltage measurement based derivation of the quiescent current flowing through a circuit portion, which can be achieved with only a small number of additional external connections.

These and other aspects of the invention will be apparent from and elucidated with reference to the embodiments described hereinafter.

Figure 2:
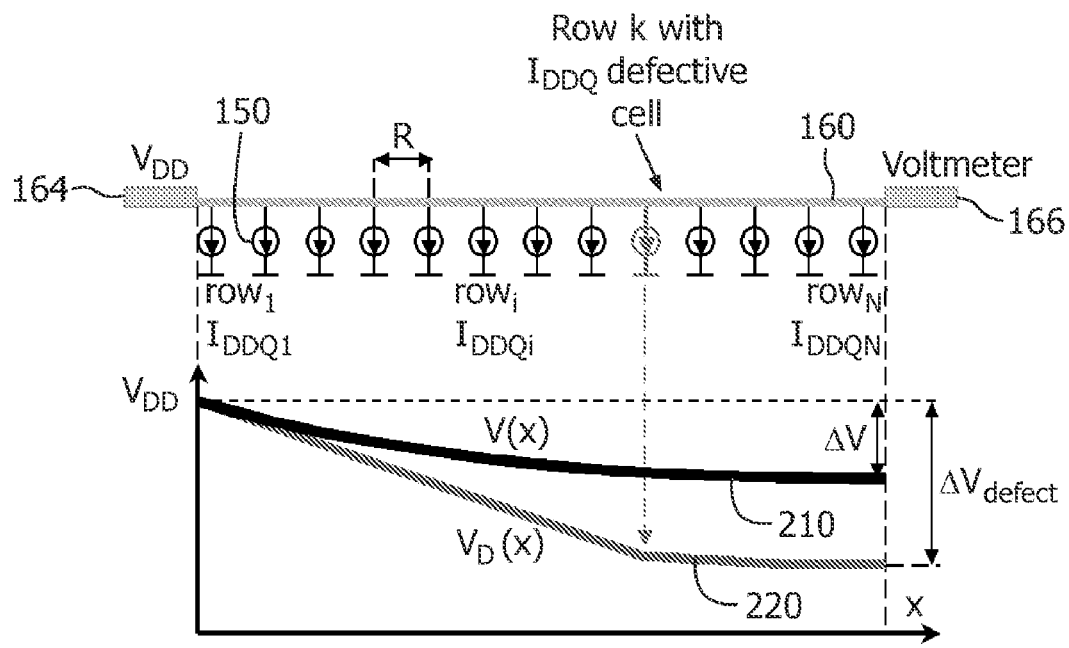
Figure 3:
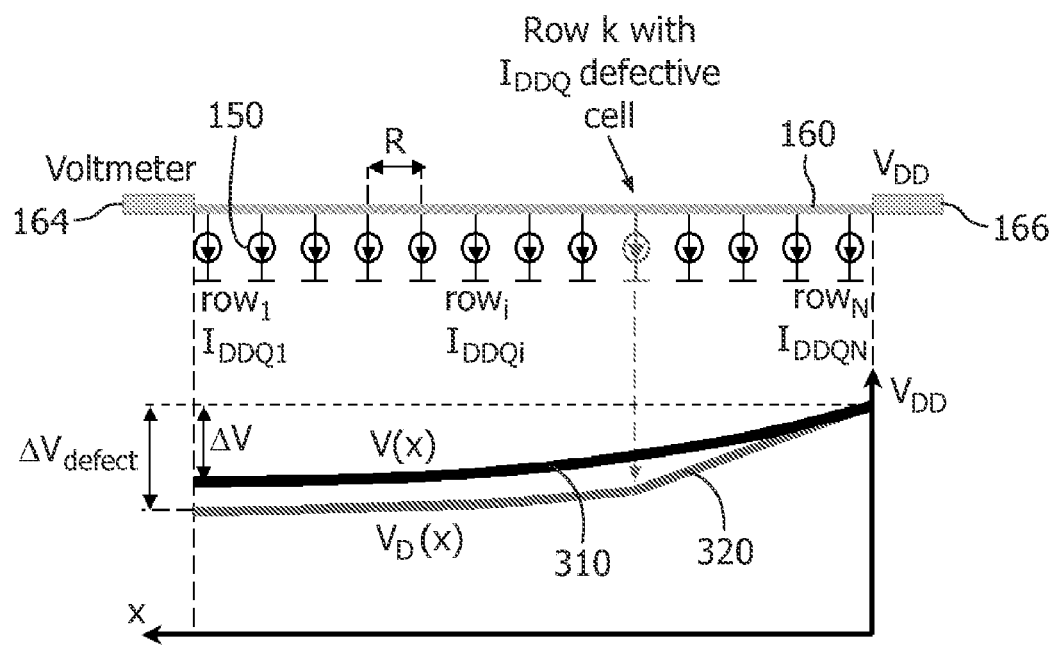
Figure 4:
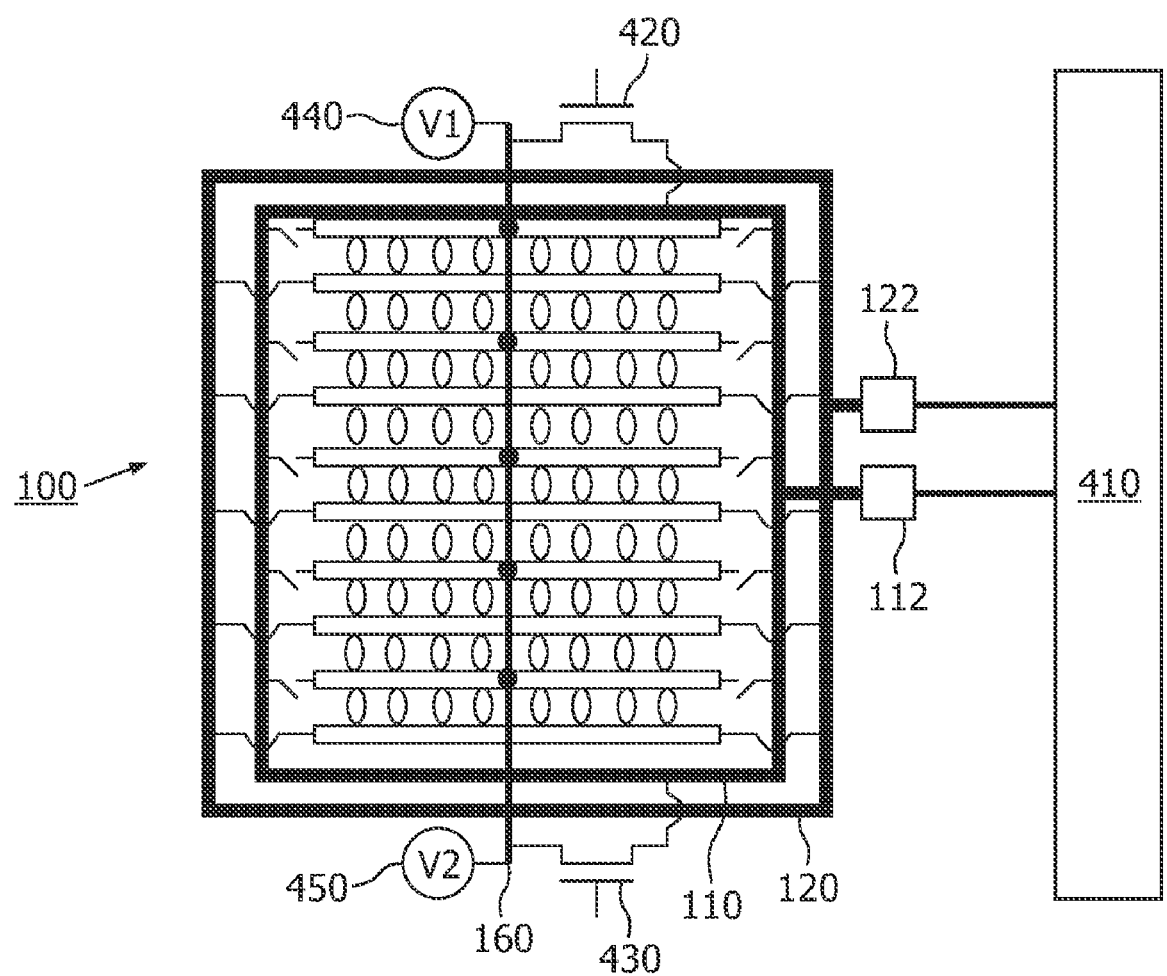
Figure 5:
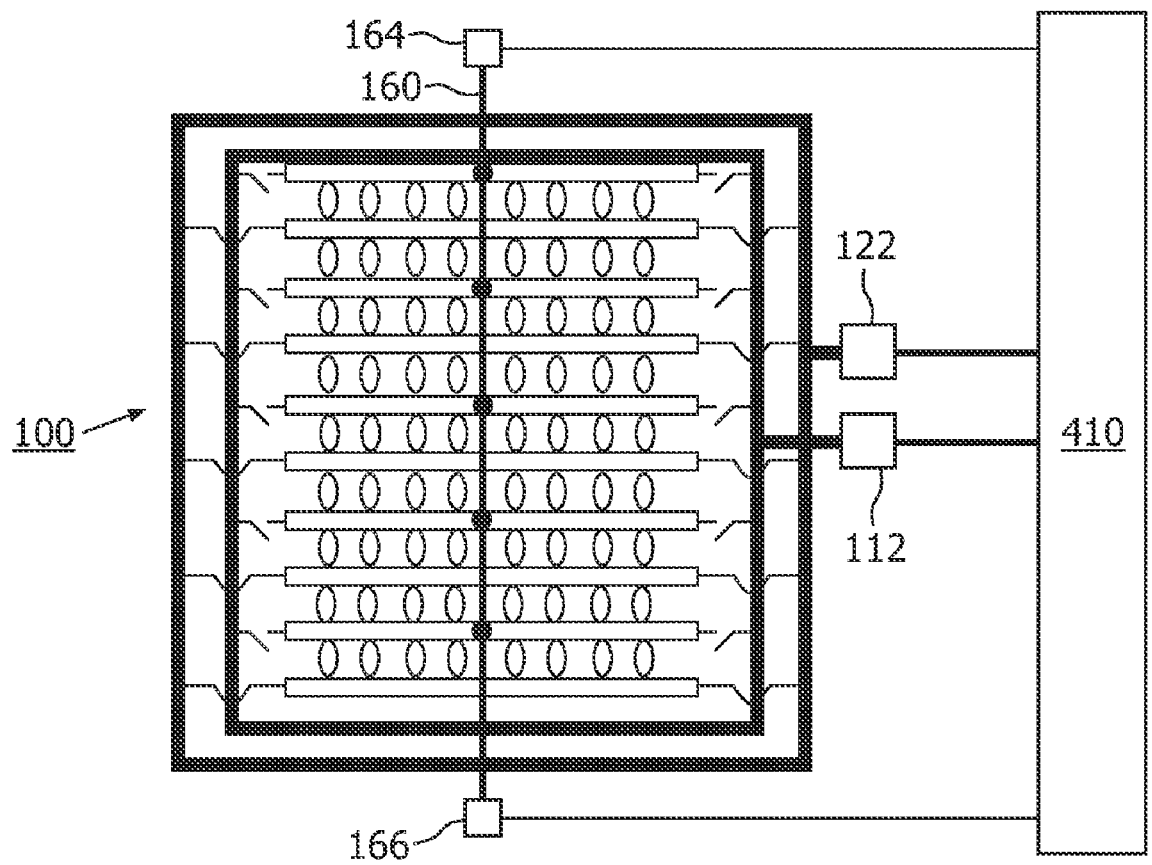
Figure 6:
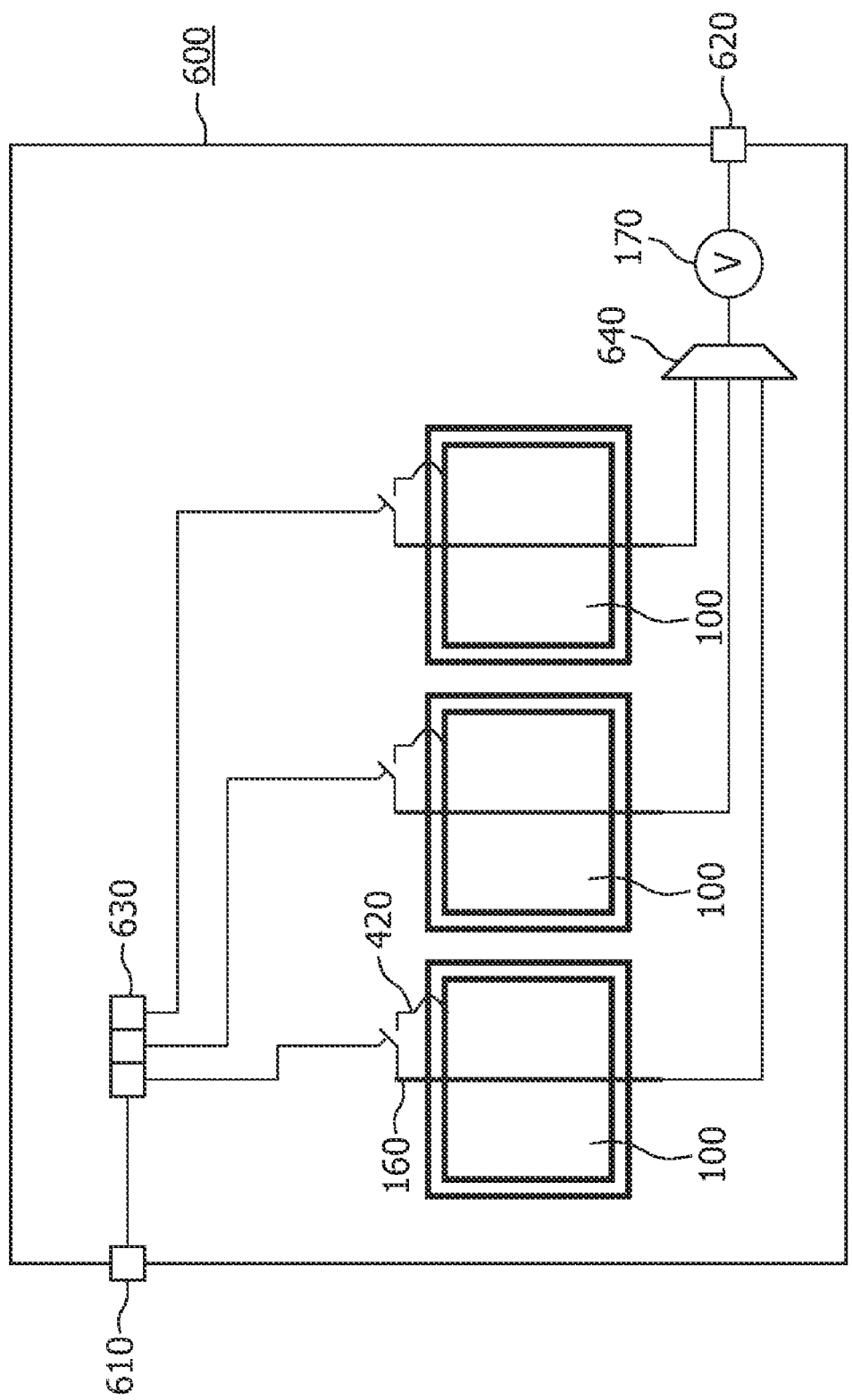

The present invention is described in more detail and by way of examples only and with reference to the accompanying drawings, in which:

FIG. 1 schematically depicts an embodiment of a circuit portion according to the present invention;

FIG. 2 shows a voltage plot retrieved from a circuit portion using an embodiment of the method of the present invention; and FIG. 3 shows another voltage plot retrieved from a circuit portion using an embodiment of the method of the present invention;

FIG. 4 schematically depicts an embodiment of test arrangement including a circuit portion according to the present invention;

FIG. 5 schematically depicts another embodiment of a test arrangement including circuit portion according to the present invention; and FIG. 6 schematically depicts an embodiment of an integrated circuit including a number of circuit portions according to the present invention.

It should be understood that the Figures are merely schematic and are not drawn to scale. It should also be understood that the same reference numerals are used throughout the Figures to indicate the same or similar parts.

FIG. 1 shows a circuit portion 100 according to an embodiment of the present invention. The circuit portion 100, which may be a memory block, a block implementing logic functionality and so on, has a first power supply rail 110 having a terminal 112 for connecting the first power supply rail 110 to a power supply terminal (not shown) and has a second power supply rail 120 having a terminal 122 for connecting the second power supply rail 110 to a further power supply terminal (not shown). Typically, a circuit portion 100 is an IC block having its own supply rail. The circuit portion 100 has a plurality of circuit portion elements 150, e.g. (standard) logic cells, memory cells, and so on, with each element 150 being coupled between a first conductive track 130 and a second conductive track 140. A group of circuit portion elements 150 between a single conductive track 130 and a single conductive track 140 is referred to as a row of circuit portion elements. The conductive tracks 130 are coupled to the first supply rail 110, e.g. the supply voltage ($V_{dd}$) rail, whereas the conductive tracks 140 are coupled to the second supply rail 120, e.g. the ground ($V_{ss}$) rail. Each conductive track 130 is coupled to the first supply rail 110 via a separate enable switch 132, e.g. a PMOS transistor for a circuit portion 100 realized in CMOS technology, although other possible implementations of such switches will be immediately apparent to the skilled person.

It will be appreciated that the configuration of the circuit portion shown in FIG. 1 is by way of non-limiting example only; several conductive tracks 130 may share an enable switch 132, in which case the number of conductive tracks 132 will be substantially higher than the number of enable switches 132 in the circuit portion 100. In addition, it will be obvious that the conductive tracks 140 may be coupled to the second supply rail 120 via one or more enable switches, e.g. nMOS transistors, in addition to or instead of the presence of the switches 132 between the first supply rail 110 and the conductive tracks 130. The enable switches 132 are typically used to disconnect the circuit portion 100 from its power supply, e.g. when the circuit portion 100 may enter a power-down mode, and may be controlled in known ways, e.g. by a system-level controller in case the circuit portion 100 forms a part of an integrated circuit implementing a System-on-Chip (SoC).

The circuit portion 100 further comprises an element 160 for determining a voltage gradient over the circuit portion in a test mode of the integrated circuit to which the circuit portion belongs. The element 160 is coupled to the conductive tracks 130 via nodes 162. The nodes 162 may be realized by vias between the metal layer implementing the conductive tracks 130 and the layer in which the element is realized, although other realizations are equally feasible. The element 160 may be a resistive wire made from a suitable resistive material such as poly-Si, although other resistive materials may be used. The element 160 may also be realized in other ways, e.g. by a chain of series-connected discrete resistors, although this would be a more laborious and costly implementation. Another possible implementation is to use CMOS transistors in inversion mode, which can be enables in the test mode of the IC.

Moreover, it should be understood that in the context of the present invention, the element 160 can be any element that has a finite resistance, i.e. an element made from any material over which a voltage gradient can be detected. Such a material may be a metal, e.g. in applications where more resistive materials such as poly-Si are deemed to be too resistive.

The element 160 has a first terminal 164 for connecting the element 160 to a power supply source (not shown) and a second terminal 166 for connecting the element 160 to a voltage measuring device 170, which may be external to the integrated circuit at which the circuit portion 100 is located. In this case, the second terminal 166 is coupled to an output of the integrated circuit to facilitate an off-chip voltage determination.

It will be appreciated that in the context of the present invention, the terminals 164 and 166 do not have to be realized by means of bond pads or the like; these terminals may simply be the end portions of the element 160. Also, the role of terminals 164 and 166 may be interchanged (vide infra).

The output of the voltage measuring device 170 may be digitized, e.g. by means of a digital to analog converter prior to making the test result available on an output of the IC comprising the circuit portion 100, which has the advantage that digital test communication means, e.g. shift registers may be used to feed the test result to the output in a controlled way.

It will be appreciated that the voltage measurement may be performed in any known way, e.g. by means of translating the voltage into a frequency through a ring oscillator and determining the voltage drop from the frequency, or by means of translating the voltage into a current and determining the voltage drop from a current measurement and so on.

The presence of the element 160 facilitates the measurement of the quiescent current $I_{DDQ}$ of the circuit portion 100 in a prepared state, as will be explained below.

In a first step of the method of the present invention, an integrated circuit comprising a circuit portion 100 as shown in FIG. 1 is brought into a test mode, and the circuit portion 100 is brought into a prepared, i.e. predefined, state. This may be done by loading an appropriate set of test data into the circuit portion elements 150, and has the effect that the circuit portion elements 150 are brought into a static state. In the next step, the enable switches 132 are opened and an $I_{DDQ}$ test cycle may start. To this end, one of the ends of the element 160, e.g. for instance the terminal 164, is conductively coupled to a power supply source, e.g. to the $V_{dd}$ supply rail 110 or an external power supply, whereas the other end of the element 160 is coupled to a voltage measuring device 170 for performing a voltage measurement.

As the enable switches 132 are now opened, i.e. the conductive tracks 130 are disconnected from the supply rail 110, the leakage current drawn by the static circuit portion elements 150 will flow from the power supply source to ground through the element 160. In this way, the voltage measuring device 170 coupled to the element 160 measures a voltage equal to the $V_{dd}$ voltage minus the accumulated drop voltage produced along the element 160 by the accumulated leakage current of the rows of static circuit portion elements 150.

It is easy to demonstrate that in absence of any defect, the voltage V'ND measured by the voltage measuring device 170 follows Equation (1):

$$V'_{ND} = V_{DD} - \Delta V_{ND} = V_{DD} - R\sum_{i=1}^{N}\sum_{j=1}^{i} I_{DDQ(N-j+1)} \quad (1)$$

where $\Delta V_{ND}$ is the total drop voltage of the non-defective circuit portion 100, R is the resistance of the element 160 between two neighbouring conductive tracks 130 (this resistance is assumed constant for all neighbouring pairs of conductive tracks 130), $I_{DDQi}$ is the quiescent current of the row i of circuit portion elements 150, and N is the total number of conductive tracks 130, which is equal to the number of rows of circuit portion elements 150.

Equation (1) can be simplified by assuming that each row of circuit portion elements 150 has an average quiescent current $I_{DDQ\_AVG}$. In this case the proper expression is shown in Equation (2):

$$V'_{ND} = V_{DD} - \Delta V_{ND} = V_{DD} - RI_{DDQ\_AVG}\frac{N(N+1)}{2} \quad (2)$$

If it is assumed that one circuit portion element 150 located at row k contains a defect that produces an abnormal quiescent current $I_{DDQdefect}$, it is easy to conclude that the measured voltage ($V'_D$) by the voltage measuring device 170 follows Equation (3):

$$V'_D = V_{DD} - \Delta V_D = V_{DD} - (\Delta V_{ND} + RkI_{DDQdefect}) \quad (3)$$

where $\Delta V_D$ is the total drop voltage of the defective circuit portion 100. Thus, the difference between the measured drop voltage of a defective and a non-defective block $\Delta V_D - \Delta V_{ND}$ is proportional to the value of the resistance R, the amount of the defective current, $I_{DDQdefect}$ and the distance measured in rows from the row containing the defective circuit portion element (k) to the end of the element 160 coupled to the power supply source.

FIG. 2 demonstrates the difference in $I_{DDQ}$ behaviour between a fault-free circuit portion 100 and a circuit portion 100 carrying a defect causing an increase in its leakage current. The spatial voltage distribution line 210 depicts the $I_{DDQ}$ behaviour of the fault-free circuit portion 100, and spatial voltage distribution line 220 depicts the $I_{DDQ}$ behaviour of the faulty circuit portion 100. In this measurement, end portion 164 of element 160 has been conductively coupled to a power supply source $V_{dd}$, and the end portion 166 has been conductively coupled to a voltage measuring device 170, e.g. a voltmeter. The defect in row k of the defective circuit portion 100 causes a drop in voltage ($\Delta V_{defect}$) over the element 160 that is larger than the drop in voltage ($\Delta V$) over the element 160 caused by the fault-free circuit portion. Another interesting observation is that the spatial voltage distribution line 220 has a breakpoint, i.e., a change in gradient, at the location of the row comprising the faulty circuit portion element 150. This characteristic can be utilized to locate the row of the defective faulty circuit portion element 150.

To this end, the roles of the respective end portions of the element 160, i.e. the respective roles of terminals 164 and 166, have to be interchanged, thus making it possible to measure the voltages at both ends of the element 160. This feature provides additional information that can be exploited to make an easier detection of the current increases due to defects as well as to facilitate the location of a defect.

A small defective $I_{DDQ}$ current can be detected and located by using this method if its accumulated effect when it passes trough the element 160 is above a given, i.e. predefined threshold. The procedure to detect/locate such defective currents comprises the execution of the following steps:

a) Put the circuit portion 100 in the desired predefined state.
b) Open the enable switches 132 such that the conductive tracks 130 become disconnected from the supply rail 110.
c) Connect one end of the element 160, e.g. end 164, to a power supply source and connect a voltage measuring device 170 to the other end of the element 160;
d) Perform a first voltage measurement ($V_1$) and store the result;
e) Invert the roles of the ends of the element 160; and
f) Perform a second voltage measurement ($V_2$) and store the result.

After this step many alternatives are possible for defect detection, which depends on the circuit portion technology and size and/or the assumed test complexity. For instance, in circuit portions having small background leakage and small variability in the leakage current it is sufficient to compare $V_1$ and $V_2$ with a fixed threshold $V_{THR}$. If one or both of the measured voltages are below $V_{THR}$, the circuit portion is defective. A more complex method that is useful for circuit portions in which a significant background leakage exists comprises measuring the differences in $V_1$ and $V_2$ in the target measurement with regard to these values in a measurement which is known as not exciting any defect. The rationale behind this decision is as follows: assume that there is no intra-die gradient in the leakage current inside the block and that Equation (2) holds. If no defect exists, voltages $V_{1ND}$ and $V_{2ND}$ are equal, according to the following Equation:

$$V_{1ND} = V_{2ND} = V_{DD} - RI_{DDQ\_AVG\_ND}\frac{N(N+1)}{2} \quad (4)$$

where the subscript ND means non-defective and $I_{DDQ\_AVG\_ND}$ is the average leakage current per row of circuit portion elements 150 if no defect exists. If a leakage gradient exists, the $V_{1ND}$ and $V_{2ND}$ voltages will not be equal because Equation (2) does not hold and should be replaced by Equation (1). In any case, if a defect exists, $V_{1D}$ and $V_{2D}$ differ from the non-defective values and from each other, due to the defective current $I_{DDQdefect}$. This gives:

$$V_{1D} = V_{DD} - (\Delta V_{ND} + RkI_{DDQdefect})$$

$$V_{2D} = V_{DD} - (\Delta V_{ND} + R(N-k)I_{DDQdefect}) \quad (5)$$

Now, from Equation (5), the increments of $V_1$ and $V_2$ can be defined as:

$$\Delta V_1 = V_{1ND} - V_{1D} = RkI_{DDQdefect}$$

$$\Delta V_2 = V_{2ND} - V_{2D} = R(N-k)I_{DDQdefect} \quad (6)$$

So, it is clear that if $\Delta V_1$ and/or $\Delta V_2$ are above a given threshold, $I_{DDQdefect}$ is detected.

Another possibility is to perform the subtraction $V_1 - V_2$. If the difference is above a given threshold it indicates the presence of a defect. If, due to intra-die process variations, there is a gradient in the leakage current inside the circuit portion 100, it can be measured as a difference between $V_1$ and $V_2$. This difference is not due to a defect. If this difference is measured in advance when the circuit portion 100 is in a reference state known not to contain any defect, this difference should be subtracted in the measurement for subsequent defect detection.

Of course, any other complex techniques for $I_{DDQ}$ testing, as for instance $\Delta I_{DDQ}$ testing or others, are fully compatible with the method of the present invention.

If the defective current flows from a single conductive track 130, it is possible to locate the defect without any knowledge of the $I_{DDQdefect}$ value by using Equation (6). By dividing $\Delta V_1$ by $\Delta V_2$, the following relation is obtained:

$$\frac{\Delta V_1}{\Delta V_2} = \frac{k}{N-k} \Rightarrow k = N\frac{\Delta V_1}{\Delta V_1 + \Delta V_2} \quad (7)$$

where k is the distance in rows of circuit portion elements 150 from the defect to the end of the element 160 connected to the power supply source and N is the total number of rows. In this way, only the difference between the two target measurements and the reference measurements needs to be calculated to locate the defect.

FIG. 3 demonstrates the difference in $I_{DDQ}$ behaviour between the fault-free circuit portion 100 and the circuit portion 100 carrying a defect causing an increase in its leakage current as determined in a measurement in which the roles of the respective end portions 164 and 166 of the element 160 have been interchanged; i.e. end portion 164 has been coupled to a voltmeter and end portion 166 has been coupled to $V_{dd}$. The spatial voltage distribution line 310 depicts the $I_{DDQ}$ behaviour of the fault-free circuit portion 100, and spatial voltage distribution line 320 depicts the $I_{DDQ}$ behaviour of the faulty circuit portion 100. In comparison to the spatial voltage distribution line 220, it will be immediately apparent that the spatial voltage distribution line 320 exhibits a smaller drop in voltage ($\Delta V_{defect}$) than spatial voltage distribution line 220 because of the smaller distance (in rows) between the row k carrying the defective circuit portion element 150 and the end portion of the element 160 that is conductively coupled to the power supply source. The respective voltage drop measurements ($\Delta V_{defect}$) as shown in FIG. 2 and FIG. 3 can be used to calculate the location of the defect as explained above, e.g. by using equation 7.

At this point, it will be apparent that although performing a single voltage measurement may suffice to detect the presence of a defect in the circuit portion 100, it is advantageous to interchange the roles of the ends of the element 160 after this measurement and to perform a subsequent measurement, because this facilitates the identification of the row on the defect is located.

It is emphasized that for a circuit portion 100 having a plurality of enable switches 132, fault location can also be achieved in an alternative way, i.e. by connecting only parts of the circuit portion 100 to $V_{dd}$ and measure a voltage drop e.g. at end portion 166 of the element 160. By enabling the enable switches 132 individually and sequentially, different sections of the circuit portion 100 are connected to the power supply rail 110 at different points in time. At the point in time where enable switch 132 associated with the section of the circuit portion 100 harbouring a fault is enabled, the drop in voltage measured over the element 160 will differ compared to the measured voltage drop over the other sections of the circuit portions 100, which is an indication of a fault being located in this section.

FIG. 4 shows an example of a test arrangement for testing a circuit portion 100. Terminal 112 of the first supply rail 110 and the terminal 122 of the second supply rail 120 are conductively coupled to respective power supply terminals (not shown) of the automated test equipment (ATE) 410. A first end of the element 160 is coupled to the first supply rail 130 via a first enable switch 420 and a second end of the element 160 is coupled to the first supply rail 130 via a second enable switch 420. The first end of the element 160 is further coupled to a first voltage measuring device 440, whereas the second end of the element 160 is further coupled to a second voltage measuring device 450.

It will be apparent that this arrangement facilitates the interchange of the roles of the respective ends of the element 160 as previously discussed. For instance, in a first measurement, the first enable switch 420 may be enabled and the second enable switch 430 may be disabled, with the second voltage measuring device 450 being used for the voltage measurement, whereas in a second measurement, the first enable switch 420 may be disabled and the second enable switch 430 may be enabled, with the first voltage measuring device 440 being used for the voltage measurement. The voltage measuring devices 440 and 450 typically have respective outputs (not shown) coupled to the ATE 410 for providing a voltage measurement result to the ATE 410.

FIG. 5 shows an alternative example of a test arrangement for testing a circuit portion 100, in which the voltage measurement is performed off-chip, i.e. on board the ATE 410. To this end, the terminals 164 and 166 of the element 160 are coupled to the ATE, which provides the power supply to one of these terminals and senses the voltage drop over the element 160 via the other terminal.

During the execution of the test method of the present invention using the test arrangements shown in FIGS. 4 and 5, the various enable switches, i.e. switches 132 and switches 420 and 430 may be controlled by known control mechanisms, e.g. by providing the circuit portion 100 with control signals (not shown) from the ATE 410 or by on-chip generation of control signals by a test controller (not shown) responsive to a test mode select signal from the ATE 410 and so on.

FIG. 6 shows an example of an integrated circuit 600 comprising a number of circuit portions 100 and having design for testability (DfT) hardware to facilitate an $I_{DDQ}$ test of a selected circuit portion 100. It will be appreciated that IC 600 has three circuit portions 100 by way of non-limiting example only; other numbers of circuit portions 100 are equally feasible. The IC 600 comprises a test data input (TDI) 610 coupled to a shift register 630. TDI 610 and shift register 630 may form a part of a standard test access mechanism such as a boundary scan test (IEEE 1149.1) compliant test access port (TAP) under control of the corresponding TAP controller, an IEEE 1500 compliant test access mechanism and so on, in which case the shift register 630 may be a register in addition to the registers mandated by these standards.

The shift register 630 is used to control the enable switches 420 of the respective circuit portions 100. It will be obvious that the shift register may also be used to control the further enable switches 430 (not shown in FIG. 6) of the respective circuit portions 100. The end portions of the elements 160 of the respective circuit portions 100 that are not coupled to the respective supply rails 130 of these circuit portions are coupled to an analog multiplexer 640, which is coupled to a voltage measuring device 170 for measuring the voltage drop over the element 160 of the circuit portion 100 selected by the bit pattern in shift register 630. The analog multiplexer 640 may be controlled by the bit pattern stored in shift register 630, or by a separate control signal, which may be derived from the bit pattern stored in shift register 630.

The voltage measuring device 170 is coupled to an output 620 for providing the voltage measurement result to the outside world, e.g. an ATE 410. The output 620 may be a test data output (TDO) in accordance with the aforementioned IEEE 1149.1 or IEEE 1500 standard, in which case the voltage measuring device 170 may be coupled to the output 620 via an analog to digital converter (not shown).

It will be appreciated that the testing of a circuit portion 100 on board an IC 600 in accordance with the method of the present invention may be implemented in many other ways than the shift-register based implementation shown in FIG. 6; for instance, the analog multiplexer 640 may be omitted, in which case each circuit portion 100 would use a dedicated voltage measuring device, and the shift register 630 may be replaced by a controller that selects the appropriate circuit portion 100 in response to a test mode select signal from an ATE 410 and so on.

It will also be appreciated that the $I_{DDQ}$ measurement technique of the present invention has been described with respect to a voltage drop with respect to $V_{dd}$ by way of non-limiting example only. Alternative voltage based measurements will be immediately apparent to the person skilled in the art; for instance, if nMOS enable switches are used between the conductive tracks 140 and a low voltage potential source such as ground, a voltage increase rather than a drop in voltage will be measured over the element 160.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit having a power supply terminal, an output and a circuit portion comprising a plurality of conductive tracks for coupling respective circuit portion elements to a power supply rail, the conductive tracks being coupled to the power supply rail via at least one enable switch, the circuit portion further comprising an element for determining a voltage gradient over the circuit portion in a test mode of the integrated circuit, the element being conductively coupled to the conductive tracks, the element having a first end portion for coupling the element to the power supply terminal and a second end portion for coupling the element to the output in said test mode.

2. An integrated circuit as claimed in claim 1, wherein the element comprises a resistive wire.

3. An integrated circuit as claimed in claim 1, wherein the power supply rail is coupled to the power supply terminal.

4. An integrated circuit as claimed in claim 3, wherein the element is coupled to the power supply rail via a first enable switch.

5. An integrated circuit as claimed in claim 1, further comprising a voltage measuring device coupled between the element and the output.

6. An integrated circuit as claimed in claim 4, further comprising a further circuit portion having comprising a plurality of further conductive tracks, the further conductive tracks being coupled to a further power supply rail via at least one further enable transistor, the further circuit portion further comprising a further element for determining a voltage gradient over the further circuit portion in the test mode of the integrated circuit, the further element being conductively coupled to the further conductive tracks, the further element having a first end portion for coupling the further element to the power supply terminal and a second end portion for coupling the further element to an output in said test mode, the further element being coupled to the further power supply rail via a second enable switch.

7. An integrated circuit as claimed in claim 6, further comprising a shift register coupled to a test data input, the shift register having a first cell coupled to the control terminal of the first enable switch and a second cell coupled to the control terminal of the second enable switch.

8. An integrated circuit as claimed in claim 5, further comprising an analog to digital converter coupled between the voltage measuring device and the output.

9. A method of testing an integrated circuit as claimed in claim 1, the method comprising:
bringing the integrated circuit in the test mode;
coupling the circuit portion to the power supply rail by switching the at least one enable switch coupled to the conductive tracks to a conductive state;
bringing the circuit portion in a predefined state; isolating at least a part of the circuit portion from the power supply rail by switching the at least one enable switch to a non-conducting state;
coupling the first end portion of the element to the power supply terminal;
coupling the second end portion of the element to a voltage measuring device; and
measuring a voltage gradient over the element.

10. A method as claimed in claim 9, wherein the step of measuring the voltage gradient is performed on board the integrated circuit, the method further comprising providing a voltage gradient measurement result on the output of the integrated circuit.

11. A method as claimed in claim 9, further comprising:
coupling the circuit portion to the power supply rail by switching the at least one enable switch coupled to the conductive tracks to a conductive state;
bringing the circuit portion in a further predefined state; isolating at least a part of the circuit portion from the power supply rail by switching the at least one enable switch to a non-conducting state;
coupling the second end portion of the element to the power supply terminal;
coupling the first end portion of the element to a voltage measuring device; and
measuring a further voltage gradient over the element.

12. A method as claimed in claim 11, further comprising determining the location of a fault inside the circuit portion from the voltage gradient measurement and the further voltage gradient measurement.

13. A method as claimed in claim 9, wherein the integrated circuit comprises a plurality of enable switches respectively coupled between the power supply rails and respective conductive tracks, the plurality of switches comprising:
a first group of enable switches including the at least one enable switch; and
a further enable switch;
wherein the step of isolating at least a part of the circuit portion from the power supply rail by switching the at least one enable switch to a non-conducting state comprises:
switching the first group of enable switches to a non-conducting state; and
switching the further enable switch to a conducting state.

* * * * *